(12) United States Patent
Bardsley et al.

(10) Patent No.: US 7,719,452 B2
(45) Date of Patent: May 18, 2010

(54) PIPELINED CONVERTER SYSTEMS WITH ENHANCED LINEARITY

(75) Inventors: Scott Gregory Bardsley, Gibsonville, NC (US); Bryan Scott Puckett, Stokesdale, NC (US); Michael Ray Elliott, Summerfield, NC (US); Ravi Kishore Kummaraguntla, Austin, TX (US); Ahmed Mohamed Abdelatty Ali, Oak Ridge, NC (US); Carroll Clifton Speir, Pleasant Garden, NC (US); James Carroll Camp, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 118 days.

(21) Appl. No.: 12/284,672

(22) Filed: Sep. 23, 2008

(65) Prior Publication Data
US 2010/0073210 A1 Mar. 25, 2010

(51) Int. Cl.
*H03M 1/20* (2006.01)
(52) U.S. Cl. ........................ 341/131; 341/118; 341/120; 341/155; 341/161; 341/162
(58) Field of Classification Search ......... 341/118–122, 341/131, 155, 161, 162
See application file for complete search history.

(56) References Cited

U.S. PATENT DOCUMENTS

| | | | |
|---|---|---|---|
| 6,373,424 B1 * | 4/2002 | Soenen | 341/161 |
| 6,404,364 B1 * | 6/2002 | Fetterman et al. | 341/131 |
| 6,456,223 B1 * | 9/2002 | Yu et al. | 341/161 |
| 6,734,818 B2 * | 5/2004 | Galton | 341/161 |
| 6,784,814 B1 * | 8/2004 | Nair et al. | 341/118 |
| 7,006,028 B2 * | 2/2006 | Galton | 341/155 |
| 7,034,736 B1 * | 4/2006 | Ali | 341/162 |
| 7,035,756 B2 * | 4/2006 | Maloberti et al. | 702/126 |
| 7,107,175 B2 * | 9/2006 | Maloberti et al. | 702/126 |
| 7,187,310 B2 * | 3/2007 | El-Sankary et al. | 341/120 |
| 7,535,391 B1 * | 5/2009 | Newman et al. | 341/131 |
| 7,602,324 B1 * | 10/2009 | Huang et al. | 341/131 |
| 2006/0227052 A1 * | 10/2006 | Tavassoli | 343/700 MS |

* cited by examiner

*Primary Examiner*—Linh V Nguyen
(74) *Attorney, Agent, or Firm*—Koppel, Patrick, Heybl & Dawson

(57) ABSTRACT

Signal converter system embodiments are provided to substantially reduce symmetrical and asymmetrical conversion errors. Signal-processing stages of these embodiments may include a signal sampler in addition to successively-arranged signal converters. In system embodiments, injected analog dither signals are initiated in response to a random digital code. They combine with a system's analog input signal and the combined signal is processed down randomly-selected signal-processing paths of the converter system to thereby realize significant improvements in system linearity. Because these linearity improvements are realized by simultaneous processing of the input signal and the injected dither signal, a combined digital code is realized at the system's output. A first portion of this combined digital code corresponds to the analog input signal and a second portion corresponds to the injected analog dither signal. The final system digital code is realized by subtracting out the second portion with a back-end decoder that responds to the random digital code.

20 Claims, 11 Drawing Sheets

PIPELINED CONVERTER SYSTEMS WITH ENHANCED LINEARITY

BACKGROUND OF THE INVENTION

1. Field of the Invention

The present disclosure relates generally to pipelined signal converters.

2. Description of the Related Art

Pipelined analog-to-digital signal converter systems are often used in high-speed, high-resolution conversion applications. These systems generally realize a desired number of conversion bits with a cascade (i.e., a pipeline) of lower-resolution converter stages and thus achieve high resolution at sampling speeds that are difficult to realize with other converter systems. Each stage of a pipelined system quantizes that stage's input signal to a predetermined number of digital bits and forms an analog output signal which is presented to a succeeding stage for further signal processing.

The advantages of sampling speed may, however, be negated if conversion linearity is insufficient. For example, the multistage structure of pipelined converter systems causes certain portions of the converter structure to be used repetitively as an analog input signal is swept over the system's input range and converter nonlinearity in these portions can significantly degrade the conversion of low-level dynamic signals.

Conversion linearity is generally characterized with a variety of linearity parameters such as differential nonlinearity (DNL), integral nonlinearity (INL), signal-to-noise ratio (SNR), signal-to-noise-and-distortion ratio (SINAD), and spurious free dynamic range (SFDR). DNL error indicates the difference between an actual step width of a least-significant bit and the ideal value while INL error measures the deviation of an actual transfer function from a straight line. SNR□ is computed by taking the ratio of the rms signal to the rms noise wherein the noise includes all spectral components minus the fundamental, the first four harmonics, and the DC offset. SINAD is the ratio (in dB) of the signal power to the power of all spectral components minus the fundamental and the DC offset. Finally, SFDR is the ratio of the fundamental component to the rms value of the next-largest spurious component (excluding DC offset).

Although a variety of linearizing techniques have been proposed for pipelined converter systems, increasing demands on these systems continue to exert a need for further improvements in linearity.

BRIEF SUMMARY OF THE INVENTION

The present disclosure is generally directed to pipelined converter systems with enhanced linearity. The drawings and the following description provide an enabling disclosure and the appended claims particularly point out and distinctly claim disclosed subject matter and equivalents thereof.

DETAILED DESCRIPTION OF THE INVENTION

FIGS. 1-11 introduce signal converter system embodiments which substantially enhance conversion linearity. Signal-processing stages of these embodiments may include an initial signal sampler in addition to successively-arranged signal converters. Typically, the signal sampler provides a respective analog output signal in the form of successive samples of a system's analog input signal and all but a back-end one of the signal converters processes an analog output signal from a preceding one of the stages into a corresponding digital code and a respective analog output signal (i.e., a gained-up residue signal). The back-end signal converter processes an analog output signal from a preceding one of the stages into a corresponding digital code but has no need to provide a respective analog output signal.

In different system embodiments of the disclosure, at least a selected one of the signal-processing stages is configured to simultaneously process two combined analog signals—the system's analog input signal and an injected analog dither signal. The combined signal is thus processed down randomly-selected signal-processing paths of the converter system to thereby induce different magnitudes and signs of INL errors. The errors of these processing paths are averaged to thereby provide significant improvements in system linearity. This processing, however, provides a combined digital code in which a first portion corresponds to the analog input signal and a second portion corresponds to the injected analog dither signal. The final system digital code is realized by subtracting out the second portion.

Figure 1:
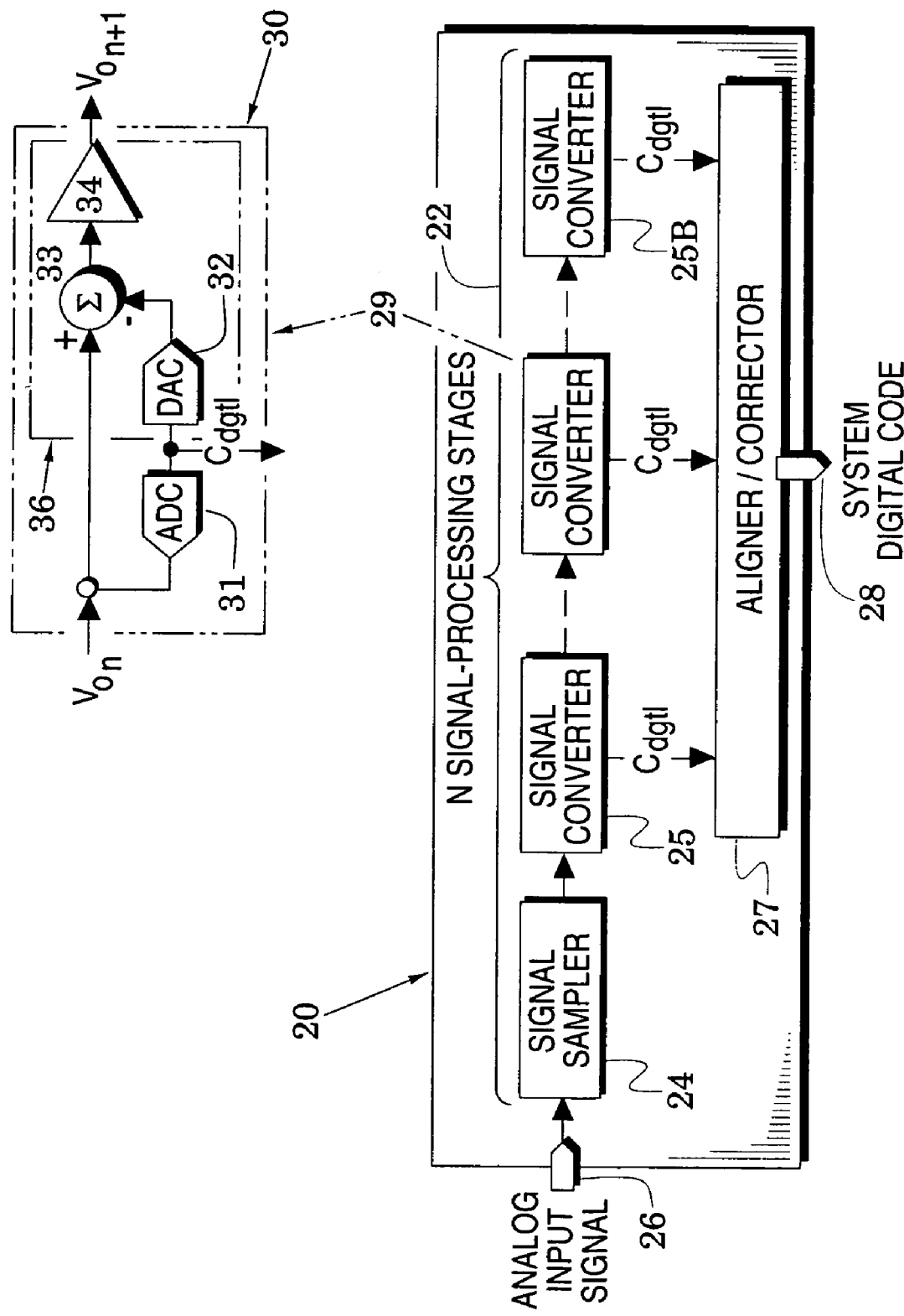
FIG. 1 is a diagram of a pipelined converter system.

In particular, system embodiments of the present disclosure are directed to analog-to-digital converter systems such as the system 20 of FIG. 1 which is formed with M successively-arranged signal-processing stages 22 that include a signal sampler 24 followed by M−1 successive signal converters 25. Except for a back-end signal converter 25B, each of the stages 22 generates a respective analog output signal and passes this signal to a succeeding stage for further processing.

Signal conversion begins with the signal sampler 24 which captures samples of an analog input signal from a system input port 26 at a sample rate. These samples form the signal sampler's respective analog output signal which is passed to the successive signal converters 25. All but the back-end one of these signal converters processes an analog output signal from a preceding one of the stages into a corresponding digital code $C_{dgtl}$ and a respective analog output signal which is passed to the succeeding converter stage. The back-end signal converter 25B processes an analog output signal from a preceding one of the stages into a corresponding digital code $C_{dgtl}$ but does not form a respective analog output signal.

The system 20 includes an aligner/corrector 27 which receives and temporally aligns the digital codes $C_{dgtl}$. Each sample from the signal sampler 24 is successively processed through the signal converters at the sample rate and, only after the aligner/corrector 27 has received the digital codes $C_{dgtl}$ from all of the signal converters 25, does it provide a system digital code at an output port 28 that corresponds to the original sample. The signal converters 25 are generally configured to provide redundant code bits and the additional conversion information in these redundant code bits is used by the aligner/corrector 27 to correct conversion errors which may occur when the analog input signal is near transition points between analog regions that correspond to adjacent digital codes.

Example arrow 29 points to an exemplary embodiment 30 of the signal converters 25. In this embodiment, an analog-to-digital converter (ADC) 31 converts the respective analog output signal of a preceding one of the stages 22 to a corresponding digital code $C_{dgtl}$. A digital-to-analog converter (DAC) 32 converts this digital code to a corresponding analog signal which is differenced with the respective analog output signal in a summer 33 to provide a residue signal. The residue signal is then "gained up" in an amplifier 34 to provide the respective analog output signal of the present stage. The gain of the amplifier 34 provides an analog window to the succeeding stage that substantially matches the analog window presented to the current stage.

Figure 2:
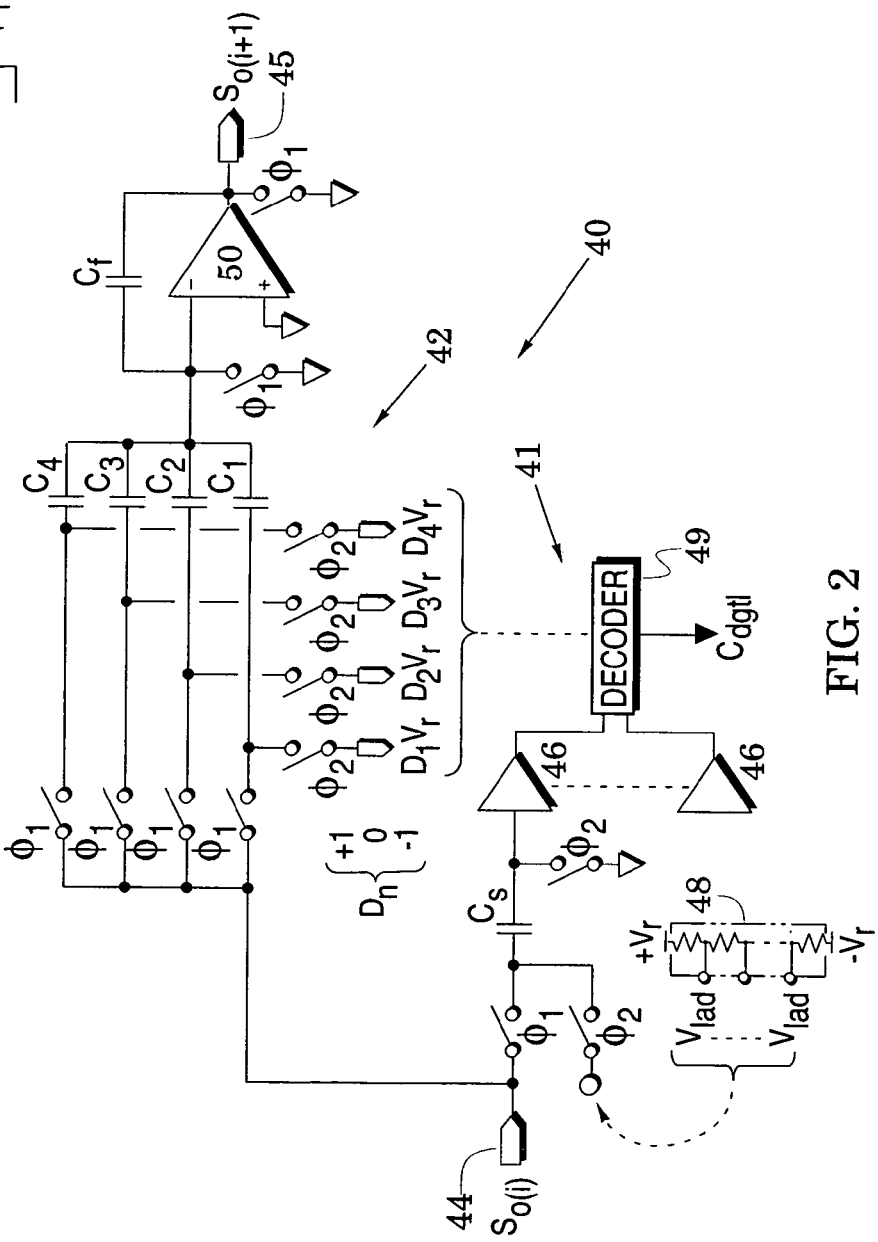
FIG. 2 is a diagram of a signal converter embodiment in the system of FIG. 1.

Because of the above-described operation, a portion 36 of the signal converter embodiment 30 is generally referred to as a multiplying digital-to-analog converter (MDAC). An embodiment 40 of one of the signal converters of FIG. 1 is shown in FIG. 2. Although this embodiment could be arranged to convert an input signal to various numbers of digital bits, the embodiment 40 is shown as an 2.5 bit stage for illustrative purposes. It should be understood that the concepts disclosed below may be applied to signal converters that provide different numbers of digital bits.

The signal converter 40 includes a switched-capacitor MDAC embodiment 42 and also includes a switched-capacitor signal comparator embodiment 41. The signal converter 40 is arranged to process an analog output signal $S_{o(i)}$ of a preceding one of the signal-processing stages at an input port 44 into a corresponding digital code $C_{dgtl}$ and a respective analog output signal $S_{o(i+1)}$ at an output port 45.

The signal comparator portion 41 couples a φ1 switch and a signal capacitor $C_s$ between the input port 44 and one of a set of signal comparators 46. A ladder 48 (e.g., a resistive ladder) provides one of a plurality of comparator threshold levels to the signal capacitor $C_s$ through a φ2 switch and another φ2 switch couples the other side of the signal capacitor to ground (similar switch, capacitor and ladder structures are provided for each of the signal comparators 46 but are not shown to enhance drawing clarity). Finally, a decoder 49 (e.g., a latchable array of digital gates) provides the corresponding digital code $C_{dgtl}$ and a set of decision signals $D_1$-$D_4$ in response to the set of signal comparators 45. It is noted that the signal comparator 41 is sometimes referred to as a flash comparator because all of the signal comparators operate in a common operational phase.

Figure 3:
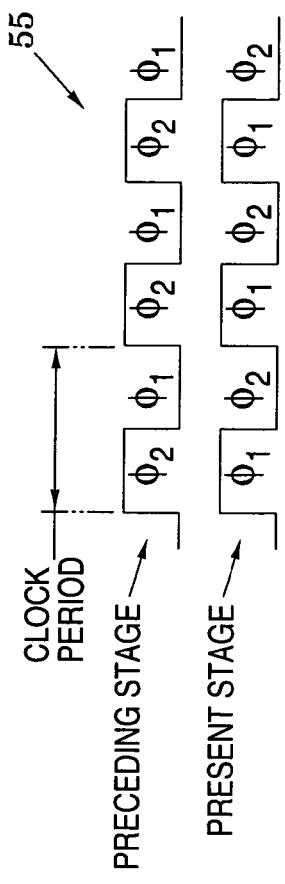
FIG. 3 is a diagram of clock signals for use in the signal converter of FIG. 2.

The signal converter 40 operates at a sample rate which is defined by the number of clock periods that occur over an exemplary time interval. The timing diagram 55 of FIG. 3 shows that the signal converter 40 of FIG. 2 operates in first and second operational phases φ1 and φ2 in each clock period. With respect to the stage of FIG. 2, the operational phases of a preceding stage and a succeeding stage are shifted as shown in FIG. 3. For example, φ1 switches of the signal comparator 41 and φ2 switches of preceding and succeeding stages close at the same times. Although clock edges are shown to temporally coincide in FIG. 3, this is for simplicity of illustration as these edges may be somewhat offset in various converter embodiments to facilitate proper operation.

During each φ2 operational phase of the signal converter 40, the signal capacitor $C_s$ is switched to charge to a ladder comparator level (supplied by the ladder 48 as indicated by a broken-line arrow) and during each succeeding φ1 operational phase, the signal capacitor $C_s$ is switched to receive the analog output signal $S_{o(i)}$ from a preceding one of the signal-processing stages. The signal at the input of the signal comparator 46 thus represents a comparison of the signal $S_{o(i)}$ and the comparator level. In an early portion of the φ1 operational phase, the state of the signal comparator is latched in accordance with this comparison. In response to all of the latched signal comparators 46, the decoder 49 thus converts the thermometer code of the comparators into the corresponding digital code $C_{dgtl}$ and the set of decision signals $D_1$-$D_4$.

The MDAC portion 42 of the signal converter 40 includes an amplifier 50 that provides the respective analog output signal $S_{o(i+1)}$ of this stage at the output port 45 and four signal capacitors $C_1$-$C_4$ which are coupled to the amplifier. A feedback capacitor $C_f$ is coupled about the amplifier 50 and φ1 switches ground the input and output of the amplifier. A set of φ1 switches couple the signal capacitors to the input port 44. In addition, a set of φ2 switches couple the signal capacitors $C_1$-$C_4$ to respectively receive subrange signals $D_1 V_r$-$D_4 V_r$ wherein the decision signals $D_1$-$D_4$ take on values +1, 0 and −1 and $V_r$ is a reference voltage.

Figure 4:
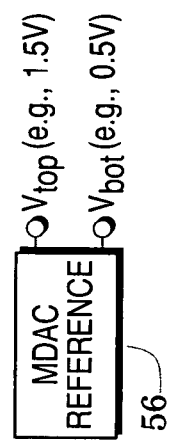
FIG. 4 is a reference signal generator which may be used in the system of FIG. 1.

In converter systems, it is generally advisable to use a set of stable reference signals throughout the system and these are preferably supplied by a single MDAC reference such as the reference 56 of FIG. 4. This reference provides stable and accurate signals $V_{top}$ and $V_{bot}$ which may, for example, be 1.5 and 0.5 volts. As shown in equations 58 in FIG. 4, these basic signals may be used throughout the system (20 in FIG. 1) to form the reference signals $+V_r$ and $-V_r$ wherein a full scale voltage $V_{fs}$ is the difference between these reference signals.

Figure 5:
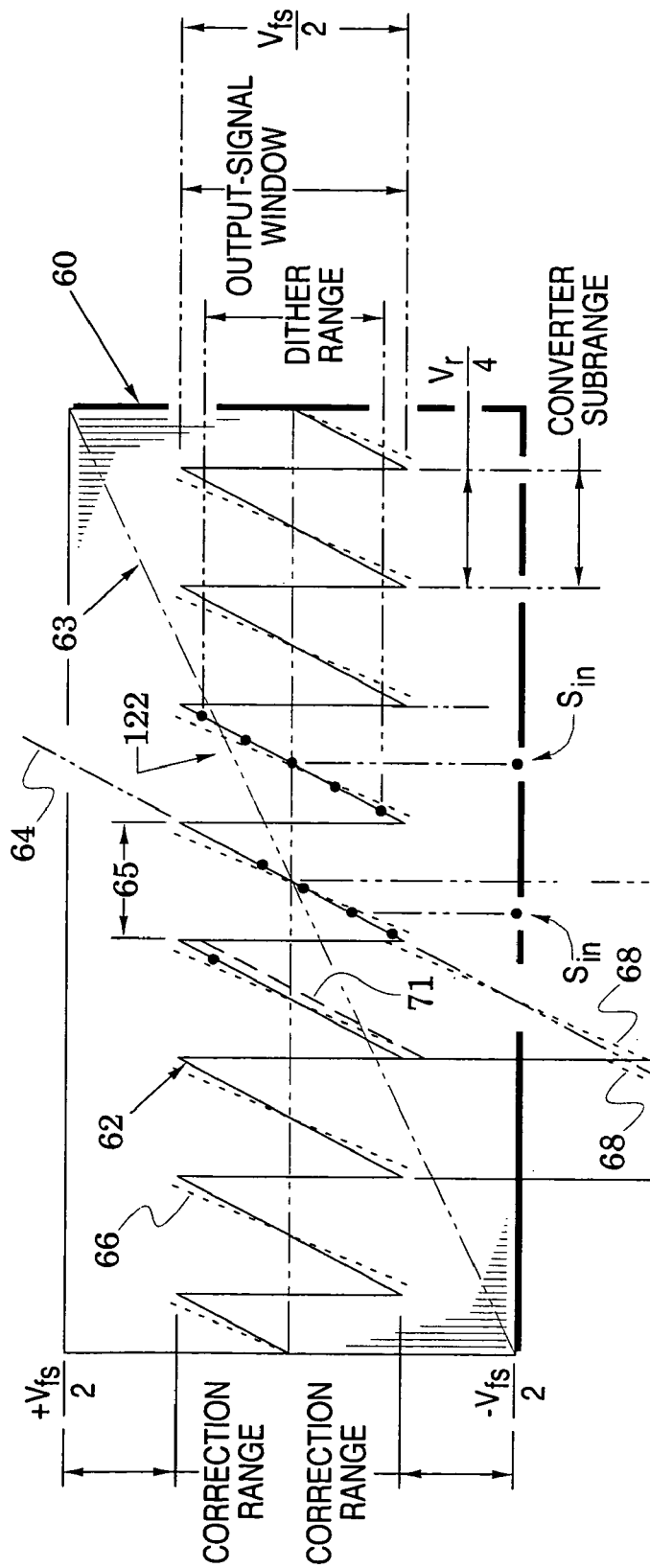
FIG. 5 is a transfer-function diagram that corresponds to the signal converter of FIG. 2.
Figure 5:
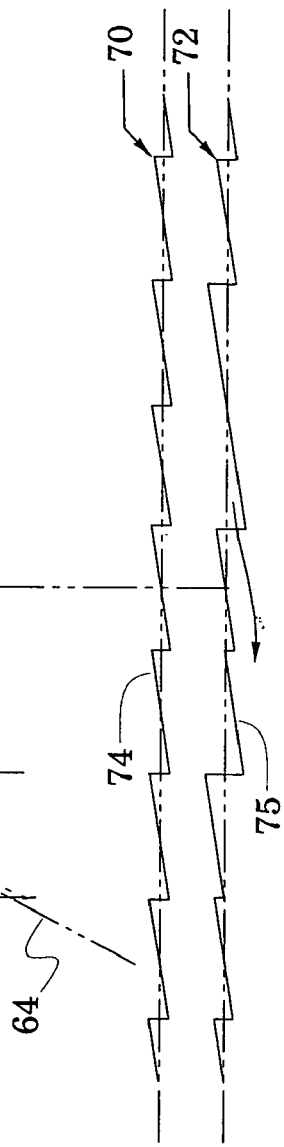

The graph 60 of FIG. 5 illustrates a transfer function 62 of the MDAC portion 42 of the signal converter 40 of FIG. 2 and a corresponding transfer function 63 of the signal sampler (24 in FIG. 1) that precedes the signal converter. To better understand the converter transfer function, attention is now directed to operation of the MDAC portion 42 of FIG. 2. It is first noted that the φ1 switches close in the φ1 operational phase so that the signal capacitors $C_1$-$C_4$ receive charges from the analog output signal $S_{o(i)}$. In the φ2 operational phase, the φ2 switches close and charges are transferred (via the gain of the amplifier 50) to the feedback capacitor $C_f$ to thereby develop the analog output signal $S_{o(i+1)}$ at the output port 45.

Assuming the gain of the amplifier 50 is sufficiently high and that the signal capacitors $C_1$-$C_4$ are sized equally to the feedback capacitor $C_f$, the gain of the MDAC portion 42 is four since the charges of four signal capacitors are transferred into a single feedback capacitor. This stage gain is indicated by an ideal reconstruct line 64 which coincides with the transfer function portion in a first converter subrange 65 in FIG. 5.

As the analog output signal $S_{o(i)}$ of FIG. 2 decreases, the decision signals $D_1$-$D_4$ in FIG. 2 successively change from 0 to +1 in response to the decoder 49 in the comparator portion 41. Accordingly, the transfer function 62 is successively urged upward (away from the ideal reconstruct line 64) by the reference signal $V_r$ and this process generates the sawtooth-shaped portion of the transfer function 62 at the left side of FIG. 5. A similar sawtooth-shaped portion is generated in a similar manner at the right side of FIG. 5 as the analog output signal $S_{o(i)}$ increases and the decision signals $D_1$-$D_4$ successively change from 0 to −1. Thus, the MDAC portion 42 of FIG. 2 generates the transfer function 62 which, as shown in FIG. 5, has an MDAC gain of four and (as labeled in FIG. 5) varies over an output-signal window in each of a plurality of converter subranges.

As the analog output signal $S_{o(i)}$ of the preceding stage varies from a negative maximum to a positive maximum, the corresponding digital code $C_{dgtl}$ from the signal comparator portion 41 of FIG. 2 will change accordingly as the operating point passes into each converter subrange of FIG. 5. If no processing errors occur in the MDAC portion 42 of FIG. 2, the analog output signal $S_{o(i+1)}$ plus the corresponding ones of the subrange signals $D_1V_r$-$D_4V_r$ should exactly equal the analog output signal $S_{o(i)}$ of the preceding stage when it is multiplied by the MDAC gain of four. That is, the sum of the analog output signal $S_{o(i+1)}$ and corresponding ones of the subrange signals $D_1V_r$-$D_4V_r$ should produce the ideal reconstruct line 64 which is initially formed by the analog output signal $S_{o(i)}$ multiplied by the MDAC gain of four.

Fabrication errors in the MDAC portion 42 will, however, cause the actual reconstruct line to differ from the ideal reconstruct line 64. If the feedback capacitor $C_f$ is smaller than intended, for example, MDAC charge transfer will be altered and the gain in each of the converter subranges will be greater than their ideal value. This gain error is indicated in FIG. 5 by broken lines 66 which show how the transfer function symmetrically tilts in each converter subrange. The sum of the analog output signal $S_{o(i+1)}$ and corresponding ones of the subrange signals $D_1V_r$-$D_4V_r$ now produce an actual reconstruct line 68 in which symmetrically differs from the ideal reconstruct line 64 in each converter subrange (for clarity of illustration in FIG. 5, the actual reconstruct line 68 is only shown in two of the converter subranges).

The difference between the ideal reconstruct line 64 and the actual reconstruct line 68 are indicated by the integral nonlinearity (INL) 70 of the signal converter (40 in FIG. 2) which is a measure of symmetrical errors (e.g., errors due to the fabrication-error in the feedback capacitor $C_f$). If the feedback capacitor $C_f$ is greater than intended or the gain of the amplifier 50 is significantly less than ideal, a similar INL will be introduced except that the slope in each converter subrange will be reversed from that shown.

In either case, the signal converter 40 of FIG. 2 will introduce undesirable symmetrical INL errors (e.g., as exemplified by segments 74 of the INL 70) into the transfer function of the converter system 20 of FIG. 1. Although these symmetrical transfer function errors have been described above to originate from incorrect feedback capacitor $C_f$ size and insufficient amplifier gain, they can also originate from other system errors (e.g., signal setting errors).

In another type of typical MDAC error that is often termed "DAC error", the signal capacitor $C_1$ may be smaller than the other signal capacitors $C_2$-$C_4$ so that, for example, the transfer function in a converter subrange on the left side of the subrange 65 is not urged upward as far as intended. This is indicated in FIG. 5 by the broken line 71 in this converter subranges. These asymmetrical types of MDAC errors will cause segments in the INL 70 to be urged up and down in different converter subranges so that both types of errors (symmetrical DAC errors and asymmetrical errors) combine to produce the INL 72. For example, the segment 74 in the INL 70 has been urged downward to the segment 75 in the INL 72 because of the transfer function error indicated by the broken line 71.

Figure 6:
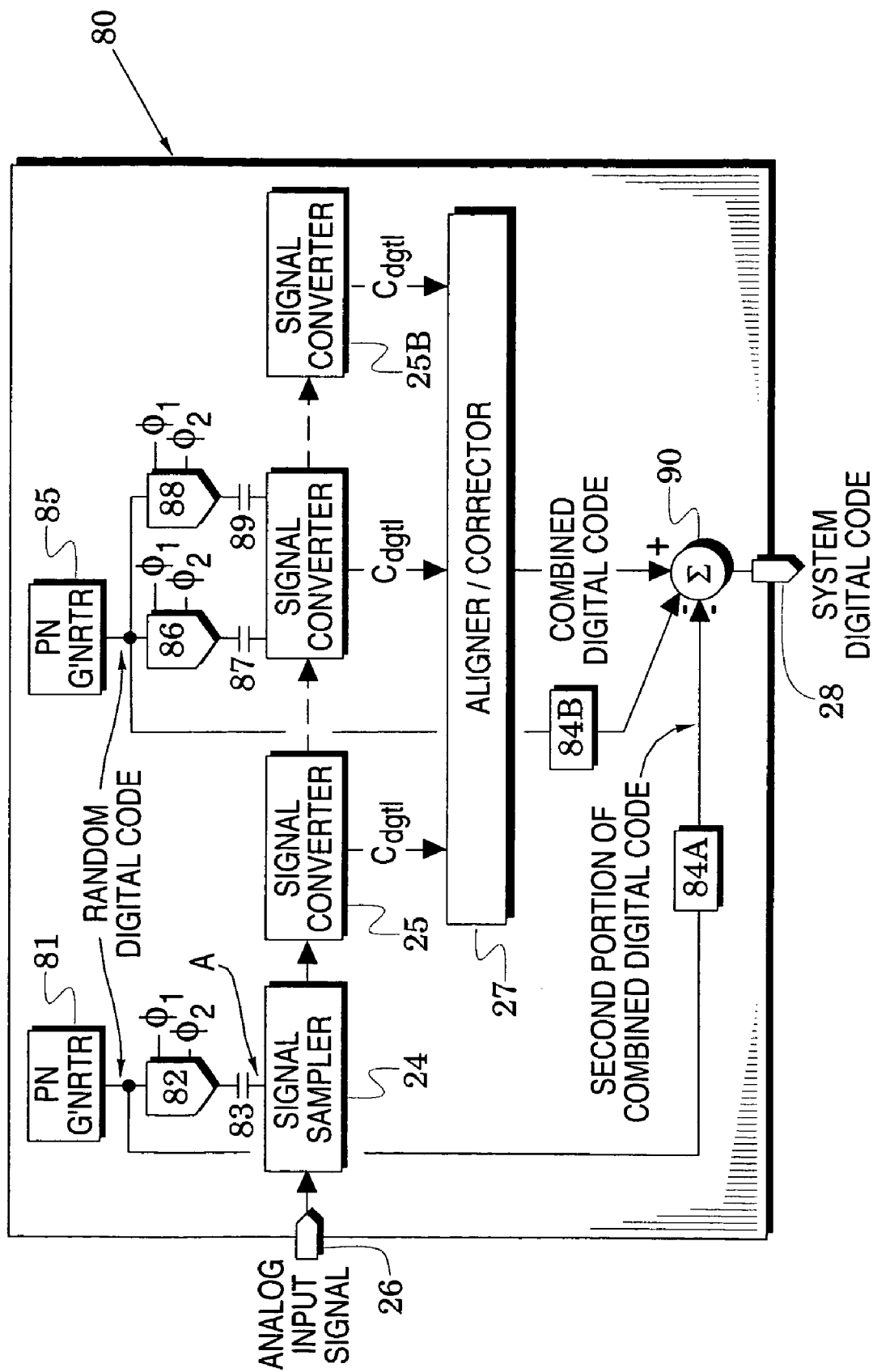
FIG. 6 is a diagram of a converter system embodiment of the present disclosure.

To substantially reduce INL errors such as those indicated in FIG. 5, the converter system 20 of FIG. 1 is altered to the system 80 of FIG. 6 which includes elements of FIG. 1 with like elements indicated by like reference numbers. In contrast to the system 20, however, the system 80 couples a pseudorandom (PN) generator 81, a DAC 82 and at least one associated dither capacitor 83 to the signal sampler 24 for injection of dither signals.

The PN generator 81 provides a random digital code wherein the number of codes is sufficient to command the DAC 82 and the dither capacitor 83 to inject a corresponding number of analog dither signals into an entry point A of the sampler 24. These injected dither signals combine with the input signal received at the input port 26 and. Accordingly, the combined signal is processed down randomly-selected signal-processing paths of the converter system which induce different magnitudes and signs of INL errors. The average error of these processing paths is reduced to thereby provide significant improvements in system linearity.

It is important to note, however, that these linearity improvements are realized by simultaneous processing of two combined analog signals—the input signal at the input port 26 and the injected dither signal. As shown in FIG. 6, this processing provides a combined digital code at the output of the aligner/corrector 27. A first portion of this combined digital code at the digital back-end of the signal converter corresponds to the analog input signal that was earlier received into the input port 26 but a second portion of the combined digital code corresponds to the injected analog dither signal. In the converter system 80, the final system digital code at the output port 28 is realized by subtracting out the second portion in a differencer 90.

As shown in FIG. 6, the second portion is provided by a back-end decoder 84A which responds to the random digital code that was generated by the PN generator 81. The transfer function of The back-end decoder 84A has a transfer function which is obtained from the transfer function of the DAC 82, the size of the dither capacitor 83, and the transfer function of the system 80 between the entry point A and the output of the aligner/converter 27.

In a different system embodiment, similar linearity improvements are realized with dither signals that are injected in a selected downstream signal converter. For example, FIG. 6 also shows a PN generator 85, a DAC 86 and at least one associated dither capacitor 87 for insertion of analog dither signals into a signal comparator portion of a selected one of the signal converters. This figure also shows another DAC 88 and at least one associated dither capacitor 89 for insertion of dither signals into an MDAC portion of the selected signal converter.

The residue signal from the preceding signal converter and the injected dither signal are simultaneously processed along randomly-selected signal-processing paths that begin at the selected converter stage. As previously described, this processing provides a combined digital code. A second portion of this combined digital code is removed in the differencer 90 wherein the second portion is provided in this embodiment by a back-end decoder 84B that responds to the random digital code of the PN generator 85. The transfer function of the back-end decoder 84B is determined by the transfer function of the DACs 86 and 88, the sizes of the dither capacitors 87 and 89, and the transfer function of the system 80 between the selected signal converter and the output of the aligner/corrector 27.

Figure 7A:
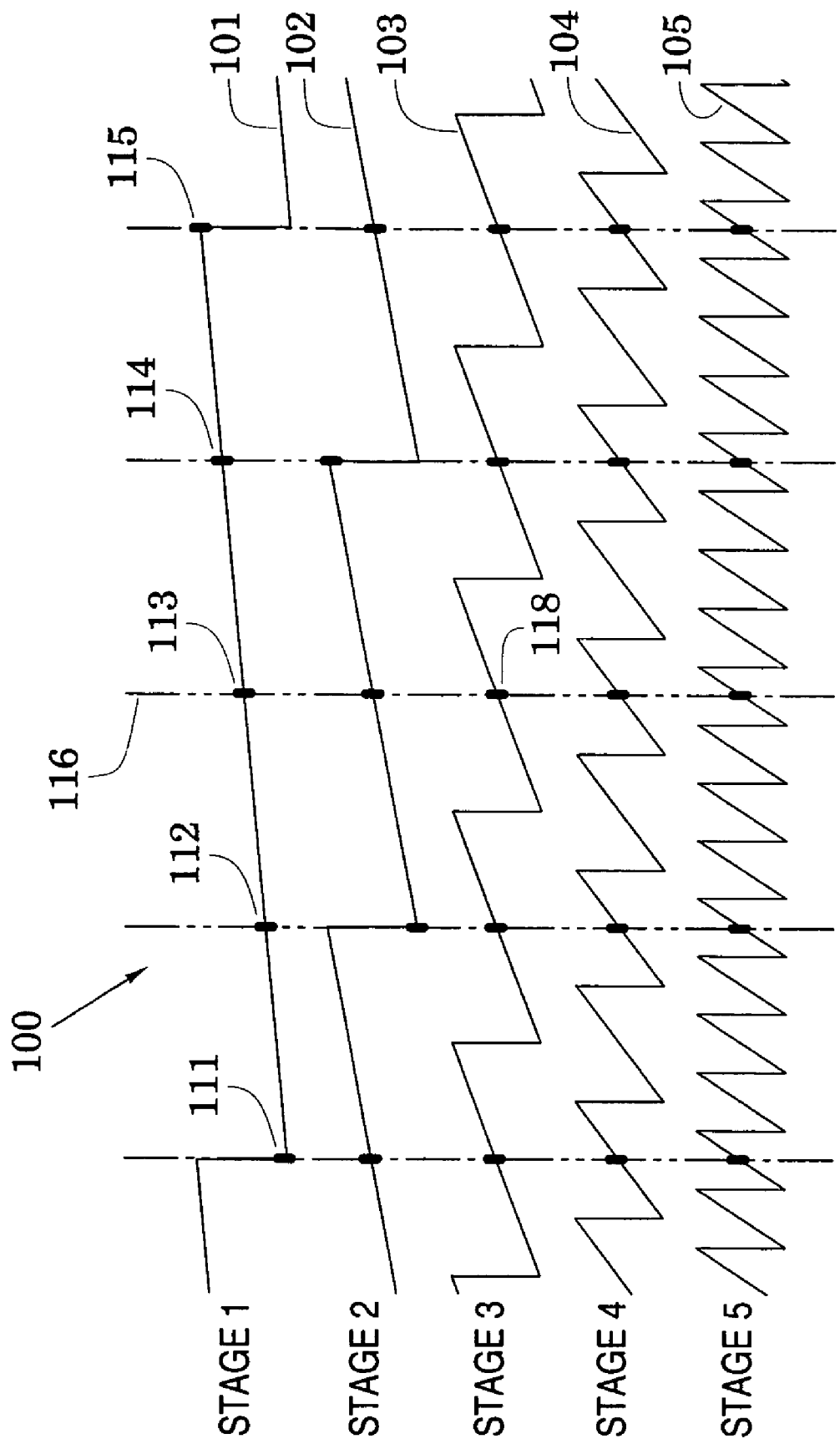
FIG. 7A illustrate transfer functions of signal-processing stages in the system of FIG. 6 and possible dither levels in these stages.
Figure 7B:
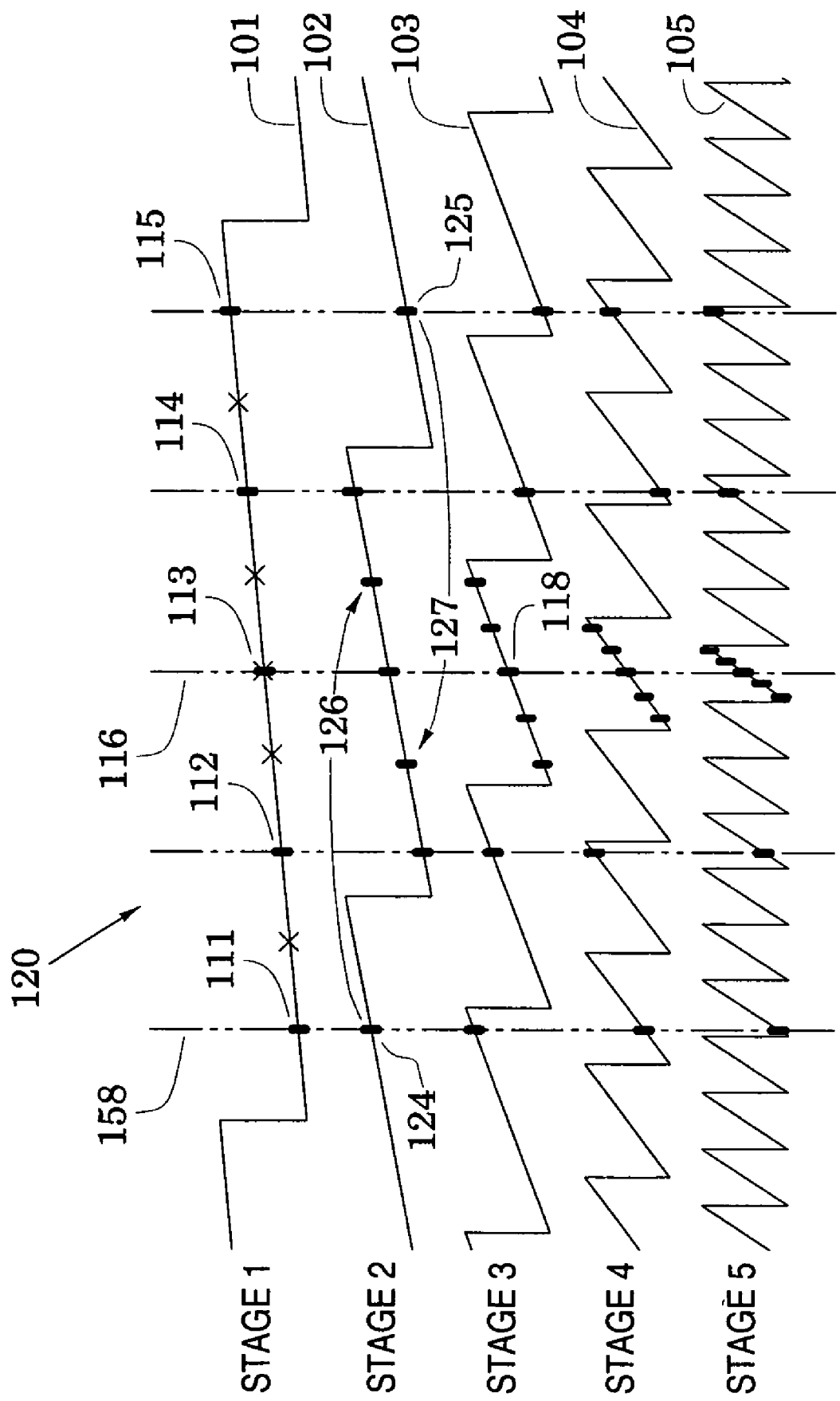
FIG. 7B is similar to FIG. 7A and illustrates preferred dither levels.
Figure 7C:
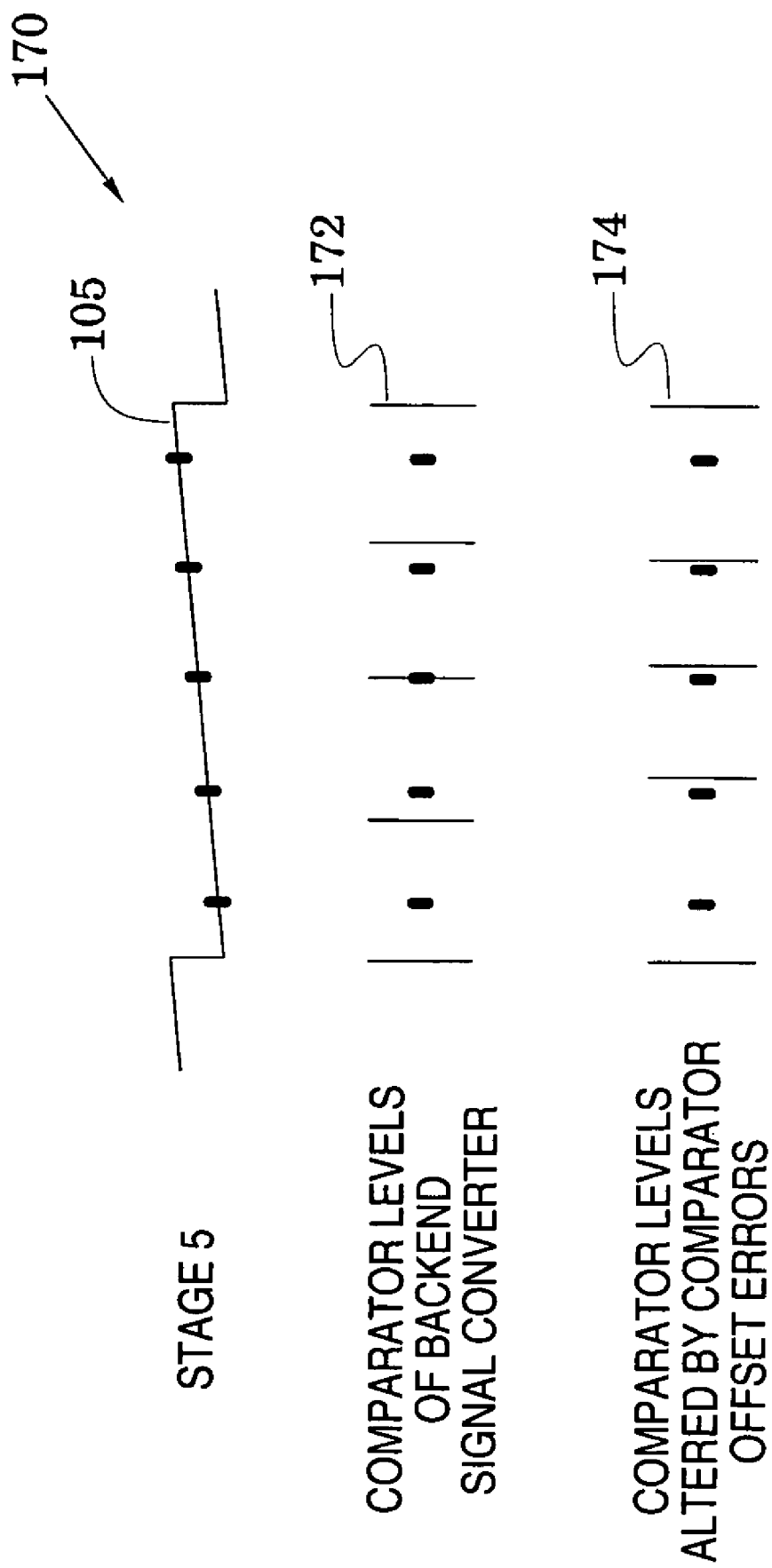
FIG. 7C illustrates comparator levels in a back-end stage that succeeds the stages of FIGS. 7A and 7B.

Advantageous operation of these additional structures is investigated in FIGS. 7A-7C. In FIG. 7A, it is assumed that the signal converters 25 of FIG. 6 comprise an initial 2.5 bit stage followed by successive 1.5 bit stages and, accordingly, this figure shows a graph 100 which plots the analog output signal 101 of the 2.5 bit stage followed by plots of the analog output signals 102-105 of the 1.5 bit stages. It is important to observe that this is an exemplary embodiment as other system embodiments may include stages that convert various other combinations of code bits.

As shown, a converter subrange of the 2.5 bit stage spans one of the converter subranges of the succeeding 1.5 bit stage and one half of each adjacent converter subrange. Similarly, each converter subrange of one of the 1.5 bit stages spans one of the converter subranges of the succeeding 1.5 bit stage and one half of each adjacent converter subrange. As exemplified in FIG. 5, the output-signal window of each stage spans $V_{fs}/2$. The transfer function of each succeeding stage is thus limited to this span which leads to the arrangement of stage transfer functions shown in FIG. 7A.

In FIG. 7A, it is assumed that the analog input signal at the input port 26 of FIG. 6 is positioned so that the current analog output signal is at the middle point 113 of analog output signal 101. It is further assumed that the PN generator 81, DAC 82 and at least one capacitor 83 are configured to dither this operating point over five operating points 111, 112, 113, 114 and 115 (in FIG. 8A, each operating point is indicated by an oblong marker) wherein operating points 111 and 115 coincide with the ends of the converter subrange.

Because the analog output signal of this converter subrange spans one of the converter subranges of the succeeding 1.5 bit stage and one half of each adjacent converter subrange, the corresponding operating points in this stage lie directly below the operating points in the first stage. This relationship follows through succeeding stages so that the dithered operating points are positioned as shown in FIG. 7A (visualization of this relationship is facilitated by vertical broken lines 116).

Inspection of the central converter subranges observes that the operating point in stage 1 is dithered over this subrange to thereby establish different signal processing paths through this stage and a lesser number of different signal processing paths through stage 2. Signal processing randomly flows along these different signal processing paths in stages 1. These paths will induce different magnitudes of INL errors having one sign and similar magnitudes of INL errors having a different sign. The average error of these processing paths will thus be substantially reduced to thereby realize significant improvements in system linearity and substantially improve the system's INL. As subsequently described, the disturbing effects of the dither signal are removed at the summer 90

It is apparent from FIG. 7A, however, that the operating point in subsequent stages 3-5 remains at the operating point prior to application of dither. In the third stage, for example, operating points such as the point 118 remain at the center of the converter subrange. Thus, the dither fails to alter the signal processing path through these latter stages. This failure is removed in the dither arrangements exemplified in FIGS. 7B and 7C.

The graph 120 of FIG. 7B is similar to the graph 110 of FIG. 7A with like elements indicated by like reference numbers. In FIG. 7B, however, it is assumed that the PN generator 81, DAC 82 and at least one capacitor 83 have been reconfigured so that the five dithered operating points are now arranged so that they span substantially ⅘ of the output-signal window, i.e., the span between operating points 111 and 115 is substantially ⅘ of the output-signal window.

At this point, attention is temporarily redirected to FIG. 5 to thereby better review the definition of some important transfer function terms. The five dithered operating points (of FIG. 7B) are shown collectively as a set 122 in one of the converter subranges of FIG. 5. As mentioned previously, the transfer function of this stage moves over an output-signal window in each of a plurality of converter subranges. The output-signal window is sufficiently reduced (e.g., it spans $V_{fs}/2$) from the full scale voltage $V_{fs}$ to establish correction ranges which accommodate extensions of the transfer function when its amplide alters because of various conversion errors (e.g., threshold errors in flash comparators). As shown in FIG. 5, the total span of the set 122 of operating points is now slightly reduced from the output-signal window. This span is defined in FIG. 5 as a dither range and is apparent that the dither range is somewhat less than the output-signal window.

Returning attention to FIG. 7B, the vertical broken lines 116 again identify operating points in the successive stages. To further aid in understanding operations in the succeeding stages, some of the operating points on the lines 116 have also been reflected inward to equivalent operating points in the central converter subrange. In the third stage, for example, operating points 124 and 125 have been reflected inward to respective operating points in the central converter subrange as indicated by respective reflection arrows 126 and 127. These are equivalent operating points in that their output voltages lie at the same level in the output-signal range even though they occupy different converter subranges.

Similar reflections have been performed in the analog output signals of the fourth and fifth stages so that equivalent operating points are now shown in the central converter subrange in all of the stages in FIG. 7B. Inspection of the central converter subranges observes that the dither range in each of the stages now covers a substantial portion of their respective output-signal windows. This is an important contrast to the situation in FIG. 7A in which there was an absence of dither range in the third, fourth and fifth stages. The applied dither now establishes different signal processing paths throughout all stages of FIG. 7B.

It is clear from FIG. 5, that the exemplary set 122 of dithered operating points corresponded to a selected system analog input signal that was located in the center of a converter subrange. To illustrate a more general situation, the analog input signal is moved leftward across the stage centerline in FIG. 5 to a different location. Although the five operating points now move across two converter subranges, the dither range is still the same and, accordingly, its total range continues to be somewhat less than the output-signal window. If these operating points were located in FIG. 7B and then reflected to common converter subranges, the dither range in each of these stages would be seen to be substantially that shown in FIG. 7B.

FIGS. 5, 7A and 7B illustrate that the system structures of FIG. 6 are generally arranged to establish, in a selected one of the signal-processing stages, a predetermined dither range which sufficiently differs from the output-signal window of that selected stage so that, in each of succeeding stages, the respective dither range covers a substantial portion of the respective output-signal window. This arrangement is exemplified in the operating points shown in the central subranges of FIG. 7B. Thus, the predetermined dither range is preferably selected so that the dither ranges in each converter stage spans a substantial portion of its respective output-signal window so that a plurality of signal-processing paths are established through these stages.

Although FIGS. 5 and 7B have illustrated an arrangement in which the predetermined dither range is less than the respective output-signal window of the selected stage, other system embodiments may be structured so that the predetermined dither range is greater than the respective output-signal window of the selected stage. These system embodiments would place some of the broken lines 116 out into adjacent converter subranges of stage 1.

As illustrated above, one example in which the predetermined dither range differs from the output-signal window is that in which the dither comprises N dither levels and the predetermined dither range is substantially (N−1)/N of the respective output-signal window of the selected stage. For example, the dither in FIG. 5 (about either of the illustrated system input signals $S_{in}$) comprises five dither levels (the operating points 111-115 in FIG. 7B) and the dither range is shown to be substantially ⅘ of the output-signal window. It has been found that this relationship embodiment in the selected signal-processing stage between the dither range and the output-signal window is a particularly effective relationship for generating different signal-processing paths.

Figure 8A:
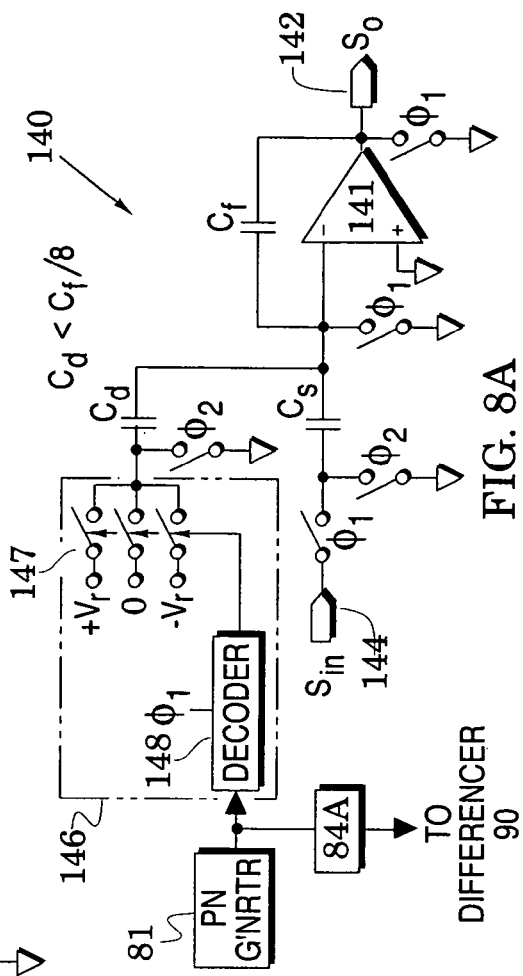
FIGS. 8A, 8B and 8C are diagrams of a signal sampler embodiments for use in the system of FIG. 6.

The selected signal-processing stage can also be the signal sampler of FIG. 6 and FIG. 8A illustrates an embodiment 140 of this stage which includes an amplifier 141 that provides the respective analog output signal $S_{o(i+1)}$ of this stage at an output port 142 and a signal capacitor $C_s$ which is coupled in series with a φ1 switch between the inverting port of the amplifier and an input port 144. A feedback capacitor $C_f$ is coupled about the amplifier 141 and φ1 switches ground the input and output of the amplifier. In addition, a φ2 switch couples the input side of the signal capacitor $C_s$ to ground.

The signal sampler 140 includes the PN generator 81 of FIG. 6 and an embodiment 146 of the DAC 82 of FIG. 6. The dither capacitor 83 of FIG. 6 is represented in FIG. 8A as a dither capacitor $C_d$ that is coupled between the DAC 146 and the inverting input of the amplifier 141. Finally, a φ2 switch couples the connection between the DAC and the dither capacitor to ground. As shown in FIG. 5, the back-end decoder 84A responds to the digital codes of the PN generator and provides a second portion of a combined digital code to the differencer 90 of FIG. 6.

In a φ1 operational phase, the φ1 switches close so that the signal capacitor $C_s$ receives charges from the input signal at the input port 144. In the φ2 operational phase, the φ2 switches close so that these charges are transferred to the feedback capacitor $C_f$ to establish the respective analog output signal $S_o$ at the output port 142. Preferably, the φ1 switch at the input to the amplifier 141 opens slightly ahead of other φ1 switches to thereby accurately establish the captured input signal. The analog output signal thus comprises successive samples of the analog input signal at the input port 144 and these samples are provided at a sample rate (which is the inverse of the clock period of FIG. 3).

In the embodiment 140, the DAC 146 comprises a set 147 of dither switches that respond to a decoder 148 which is coupled to receive the random digital code from the PN generator 81. In response to the decoder, the switch set selectably couples reference signals $-V_r$, 0 and $+V_r$ to the dither capacitor $C_d$. These reference signals are preferably provided by the reference generator 56 of FIG. 4.

In the φ1 operational phase, the decoder selectively couples, in response to the PN generator, one of the reference signals to the dither capacitor $C_d$ and, in the φ2 operational phase, the received charge is transferred to the feedback capacitor $C_f$ to thereby dither the analog output signal $S_o$ at the output port 142. To further describe operation of the signal sampler, it is assumed that the initial signal converter (that follows the signal sampler) has the transfer function 62 of FIG. 5. If the signal capacitor $C_s$ and feedback capacitor $C_f$ of the signal sampler are equally sized and the analog input signal at the input port 144 of FIG. 8A changes by a voltage equal to $V_r$, then the operating point will move half way across the transfer function 62 of FIG. 5.

Noting in FIG. 5 that each converter subrange has a width $V_r/4$, it becomes apparent then that the operating point will be dithered across ½ of the converter subrange if the dither capacitor has a size of $C_f/8$ and the DAC 146 of FIG. 8A applies successive voltages of 0 and $+V_r$. FIG. 5 illustrated an operational embodiment in which the dither range was somewhat less than the output-signal window. To realize this operation, the dither capacitor, therefore, should be sized somewhat less than $C_f/8$ as indicated in FIG. 8A.

In the signal sampler of FIG. 8A, the decoder selectively applies three different reference signals in the φ1 operational phase so that a three level dither is realized. This might, for example, establish in the initial signal converter the operating points 111, 113 and 115 in FIG. 7B.

Figure 8B:
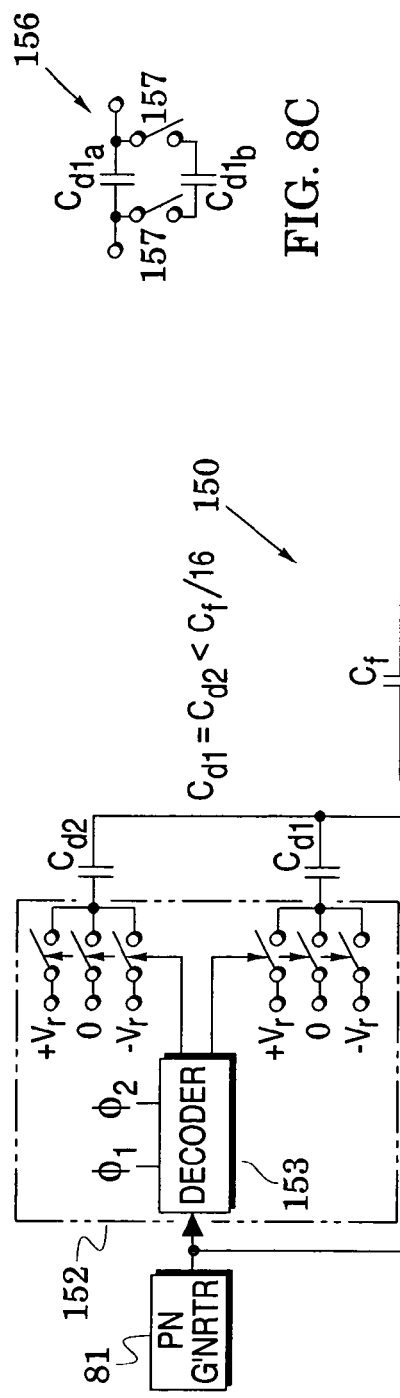

FIG. 8B shows a signal sampler embodiment 150 which is similar to the embodiment 140 with like elements indicated by like reference numbers. In contrast, however, the signal sampler 150 has two dither capacitors $C_{d1}$ and $C_{d2}$ and a DAC 152 which includes a decoder 153 that operates in both of the φ1 and φ2 operational phases. In addition, the φ2 switch at the output of the DAC 146 in FIG. 8A is eliminated in FIG. 8B. In one sampler embodiment, the dither capacitors $C_{d1}$ and $C_{d2}$ are equally sized and are each sized to be less than $C_f/16$.

Operation of the signal sampler 150 will first be described with the assumption that only the dither capacitor $C_{d1}$ is used. In response to the PN generator 81, the switches of the decoder 153 can apply a selected reference signal to the dither capacitor $C_{d1}$ in the φ1 operational phase and another selected reference signal in the φ2 operational phase. If 0 is applied in the φ1 operational phase, then selections of $-V_r$, 0 and $+V_r$ can establish three different operational points in the φ2 operational phase of the initial signal converter (e.g., the operating points 112, 113 and 114 in FIG. 7B).

If $-V_r$ is applied in the φ1 operational phase, then selection of $+V_r$ in the φ2 operational phase will establish an additional operational point in the φ2 operational phase (e.g., the operating point 115 in FIG. 7B). If $+V_r$ is applied in the φ1 operational phase, then selection of $-V_r$ in the φ1 operational phase will establish another additional operational point in the φ2 operational phase (e.g., the operating point 111 in FIG. 7B). The additional use of the φ2 operational phase can be structured, therefore, to apply a five level dither similar to the operational points 111, 112, 113, 114 and 115 in FIG. 7B.

When the dither capacitor $C_{d2}$ is added to this operation, it can add its charges to those of the dither capacitor $C_{d1}$ and it can be sized smaller than the dither capacitor $C_{d2}$ to thereby realize an additional four dither levels so that a total of nine dither levels are available. These additional dither levels are indicated in FIG. 7B by x's that are positioned between the operational points 111, 112, 113, 114 and 115.

In one dither embodiment, therefore, the dither capacitors $C_{d1}$ and $C_{d2}$ are differently sized and are both sized to be less than $C_f/16$. Initially using only the dither capacitor $C_{d1}$, the five dither levels 111, 112, 113, 114, and 115 can be realized. With the smaller dither capacitor $C_{d1}$ then providing sufficient charge to extend these dither levels, the additional dither levels marked by x's can be realized for a total of nine dither levels. Other dither embodiments can add additional dither capacitors and operate them in similar manners to establish even greater numbers of dither levels (e.g., 17, 21 and so on).

The different operating points in FIG. 7B illustrate the processing advantages of dither structure embodiments of the present disclosure. For example, assume that the system analog input signal is such that first signal converter stage of FIG. 1 operates at the operating point 111 in FIG. 7B. The input signal would then be successively processed through succeeding stages along a processing path indicated by the broken line 158 in FIG. 7B. If one or more of these stages have structural inaccuracies such that they generate an INL similar to the INL 70 in FIG. 5, then they will introduce conversion errors due to the nature of their INL errors.

With the structural embodiments of the present disclosure, however, a nine level dither can be established about the operating point 111 (similar to the nine level dither shown about the operating point 113). The analog input signal will now be randomly processed through the system along nine different processing paths. As indicated by the INL 70 of FIG. 5, some of these paths will induce different magnitudes of INL errors having one sign and others of these paths will induce similar magnitudes of INL errors having a different sign. Accordingly, the average error of these processing paths will be substantially reduced and the system's INL will be substantially improved.

As noted above with respect to FIG. 6, these linearity improvements are realized by simultaneous processing of two combined analog signals—the input signal at the input ports 144 in FIGS. 8A and 8B and the injected dither signal. The resultant combined digital code at the output of the aligner/corrector 27 of FIG. 6 includes a second portion which corresponds to the injected dither signal. The back-end decoder 84A in FIGS. 8A and 8B provides this second portion so that it can be removed in the differencer 90 of FIG. 6.

Up to some point, it has generally been found that greater numbers of processing paths will yield greater improvement in the system's INL. That is, a signal sampler (e.g., the sampler 150 of FIG. 8B) with a greater number of dither levels (e.g., 9 levels) will realize a system INL that is superior to the system INL realized with a lesser number of dither levels (e.g., 3 levels). Essentially, larger numbers of operational dither points further spread signal harmonics (generated by INL errors) into the noise floor at the system output (e.g., at the output port 28 in FIG. 6). At some point, obviously, the advantages gained by additional levels will be offset by the additional structural complexity.

Although the description above has shown that systems such as the converter system 80 of FIG. 6 are effective in reducing symmetrical INL errors, it has been found that they are also effective in reducing asymmetrical INL errors. To explain this reduction of asymmetrical INL errors, is first recalled that asymmetrical INL errors can be generated when MDAC signal capacitors (e.g., signal capacitors $C_1$-$C_4$ in FIG. 2) are not identically sized. It is next noted that the INL 72 of FIG. 5 illustrates asymmetrical INL errors in which INL segments that correspond to different converter subranges are vertically displaced. Some are displaced upward and others are displaced downward.

Attention is now directed to the analog output signal plots of FIG. 7B which correspond to an initial 2.5 bit converter stage followed by successive 1.5 bit converter stages. The vertical broken lines 116 indicate that the five dither levels 111 through 115 in stage 1 are processed through five different subranges of stage 3. Thus, the processing paths randomly pass through different signal capacitors in stage 3 and this action substantially reduces the asymmetrical INL errors that are generated because of sizing differences in the signal capacitors. Essentially, the dither levels randomize the subrange to subrange errors in stage 2. Similar randomization takes place in other stages (e.g., stages 3-5).

System description to this point has disclosed that a selected system stage may include an amplifier (141 in FIG. 8A) that provides the respective output signal of the selected stage, at least one signal capacitor ($C_s$ in FIG. 8A) that is switched to transfer signal charges to the amplifier from an appropriate one of the analog input signal and the analog output signal of a preceding stage, and at least one dither capacitor that is switched to transfer dither charges to the amplifier whereby the amplifier urges the respective output signal over the predetermined dither range.

In different system embodiments, the dither capacitor is switched to transfer dither charges from a set of reference signals, is switched to the reference signals at the sample rate, and is switched to the reference signals at twice the sample rate. In other system embodiments, the at least one dither capacitor comprises a plurality of substantially-equal dither capacitors. Generally, the dither capacitors are sized to adjust the predetermined dither range so that, in the selected stage and in each of succeeding stages, the respective dither range covers a substantial portion of the respective output-signal window.

The dither capacitors are preferably sized to adjust the predetermined dither range to enhance this portion in the selected stage and in each of succeeding signal converters. In a particular system embodiment, the dither comprises N dither levels and the dither capacitors are sized to adjust the predetermined dither range to be substantially (N−1)/N of the respective output-signal window of the selected stage.

At this point, it is noted that the dithering structures shown in FIGS. 8A and 8B will inevitably insert a small amount of noise into the conversion system. When large amplitude input signals are being processed, the disadvantage of this relatively low level of additional noise is outweighed by the system advantages realized through dithering. When processing lower-levels of analog input signals, however, the noise disadvantage becomes more important. In addition, the reduced input signal now occupies a small portion of an initial converter subrange so that symmetrical INL errors in this stage are reduced. In the presence of low-level input signals, therefore, it may be advantageous to turn off dither in one or more upstream stages.

Figure 8C:
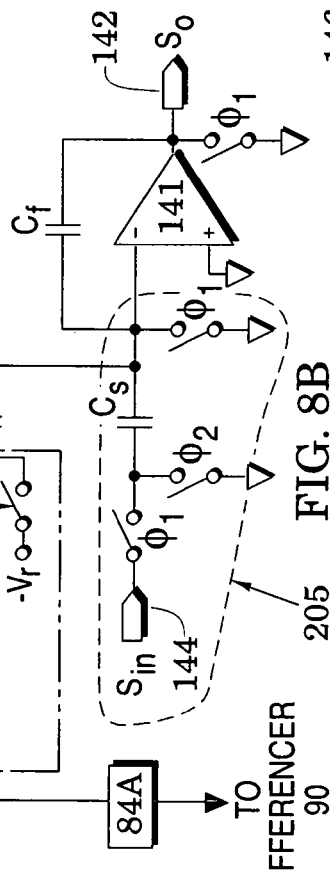

Accordingly, the diagram 156 of FIG. 8C shows that each of the dither capacitors of FIGS. 8A and 8B may comprise a plurality of sub-dither capacitors $C_{d1a}$ and $C_{d1b}$ that can be switchably combined (or separated) by switches 157. Sub-dither structures such as these can be used to reduce dithering amplitude when the associated converter system is processing lower-level analog input signals. In one operational embodiment, for example, sub-dither capacitors are switched together to achieve the operations previously described. In another operational embodiment, one or more of the sub-dither capacitors can be switchably removed from the transfer of the dither charges.

The sub-dither capacitors of FIG. 8C permit a reduction of the dither amplitude so that it is suitable for a downstream stage where the low-level analog input signal will still generate significant symmetrical INL error. As an example, FIG. 7B shows a nine level dither across a dither range that is somewhat reduced from the initial stage's output-signal window. This can be obtained when the sub-dither capacitors are coupled together. When the switches 157 are opened so that only the sub-dither capacitor $C_{d1a}$ is operative, the dither range in stage 1 will be significantly reduced but the dither range in stage 2 will continue to cover the substantial portion of this stage's output-signal window. In a similar manner, the sub-dither structures of FIG. 8C can be configured to realize further dither reductions that are directed to other stages. For example, another dither range reduction of two would reduce the dither range in stage 2 but the dither range in stage 3 would continue to cover the substantial portion of this stage's output-signal window.

Figure 9:
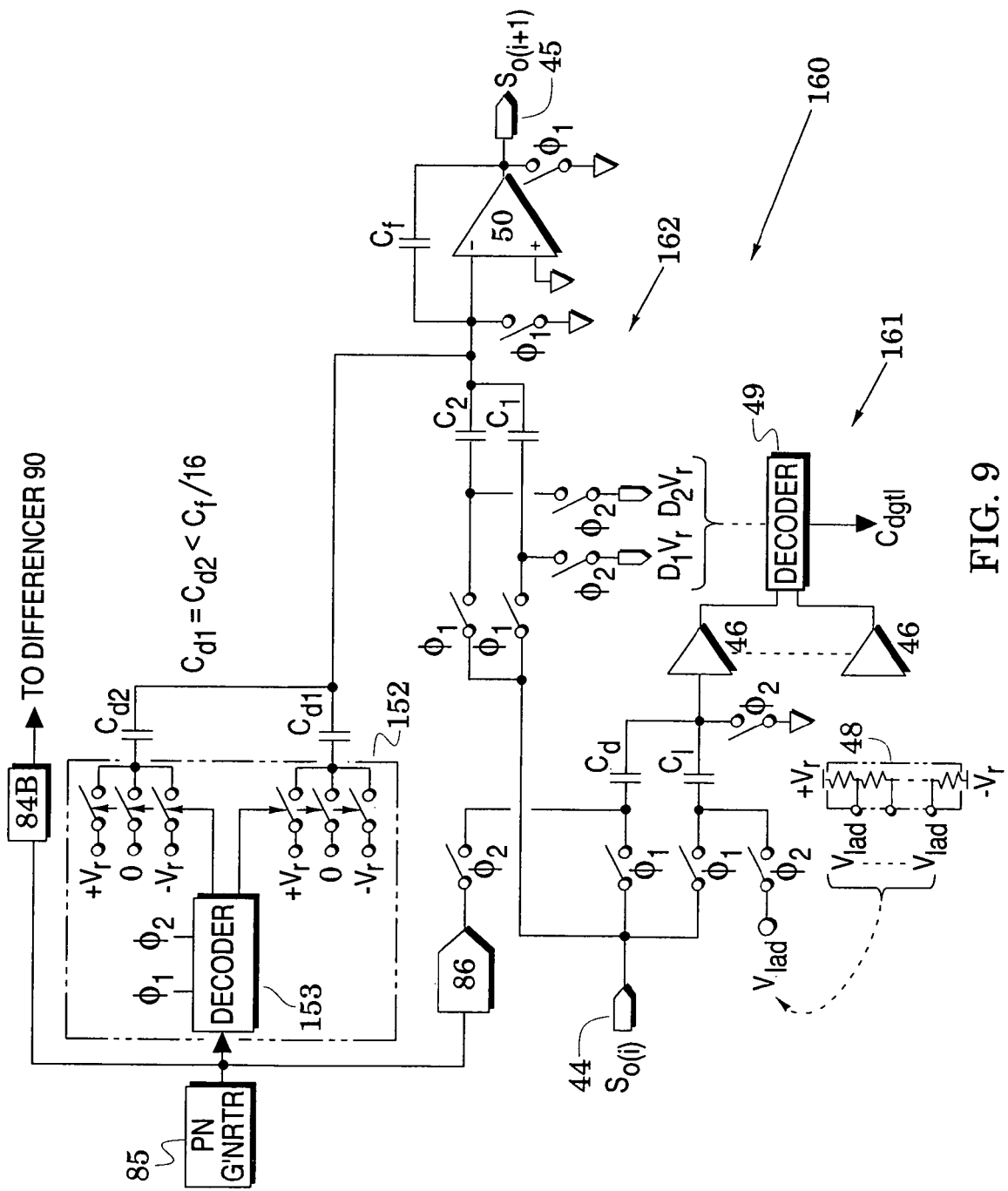
FIG. 9 is a diagram of a signal converter embodiment for use in the system of FIG. 6.

Dither range in upstream system stages can also be reduced (or eliminated) by adding structure to introduce the dither in a downstream signal-processing stage. For example, FIG. 9 illustrates an embodiment 160 of one of the downstream signal converters in FIG. 6 which may be used to complement signal sampler dither structures (e.g., that of FIG. 8B). This figure includes elements of the signal converter 40 of FIG. 2 with like elements indicated by like reference numbers. The signal comparator section 41 of FIG. 2 has, however, been altered to a signal comparator section 161 that replaces the signal capacitor $C_s$ of FIG. 2 with a ladder capacitor $C_1$ and places a φ1 switch and a dither capacitor $C_d$ in parallel with the ladder capacitor $C_1$ and its associated φ1 switch (the dither capacitor $C_d$ was shown as the capacitor 87 in FIG. 6).

In addition, the DAC 86 of FIG. 6 and a series φ2 switch are coupled from the PN generator 81 to drive the dither capacitor $C_d$. The MDAC portion 42 of FIG. 2 has also been altered to an MDAC portion 162 that only includes signal capacitors $C_1$ and $C_2$ (although signal capacitors $C_3$ and $C_4$ have been eliminated in this MDAC, they could be retained in other MDAC embodiments to process different numbers of bits (e.g., 2 or 3 bits).

Because the signal converter 160 is assumed to be a 1.5 bit converter stage, its MDAC section only requires two signal capacitors. In the illustrated embodiment of FIG. 9, this section includes the DAC 152 which was described above with reference to the signal sampler 150 of FIG. 8B. In accordance with that description, the DAC 152 applies dither signals to dither capacitors $C_{d1}$ and $C_{d2}$ during the φ1 and φ2 operational phases. The dither capacitors $C_{d1}$ and $C_{d2}$ are sized to dither the analog output signal $S_{o(i+1)}$ over a range somewhat less than the output-signal window of this stage.

The dither structures of FIG. 9 include embodiments of the DAC 88 and capacitor 89 that were shown in FIG. 6. As first shown in FIG. 6, the back-end decoder 84B is also included in FIG. 9 to respond to the digital codes of the PN generator 85 and provide the second portion of the combined digital code to the differencer 90 of FIG. 6.

The φ2 switches in the comparator section 161 allow the DAC 86 and the ladder 48 to respectively transfer a dither charge and a ladder charge into the dither capacitor $C_d$ and the ladder capacitor $C_1$ during the φ2 operational phase. At the start of the succeeding φ1 operational phase, the analog output signal $S_{o(i)}$ of the preceding stage applies a signal charge to these capacitors. In absence of the dither capacitor, this operation would apply to the comparator 46 the difference between the analog output signal $S_{o(i)}$ and the ladder signal.

The dither capacitor offsets this comparison by the value of the dither signal. The latched output of the comparator then reflects a comparison of the analog output signal $S_{o(i)}$ to the ladder signal as offset by the dither signal. With this operation, decision signals $D_1$ and $D_2$ are provided to the MDAC section 162 at the start of the φ2 operational phase. The transferred dither charge essentially alters the signal that is stored during the φ2 operational phase so that the analog output signal $S_{o(i)}$ is compared, instead, to the sum of these signals.

The dither capacitor and/or the analog signal from the DAC 86 are sized so that the alteration in the signal comparator portion 161 matches the dither range inserted by the dither capacitors $C_{d1}$ and $C_{d2}$ of the MDAC section 162. Accordingly, the signal comparator section 161 and the MDAC section 162 "see" the same dithered alteration of the analog output signal $S_{o(i)}$. In the illustrated embodiment of FIG. 9, there is one dither capacitor C in the signal comparator portion 161 and the DAC 86 responds to each of the codes of the PN generator 85 to appropriately alter the signal that is being processed in the signal comparator section.

Beginning with the signal converter of FIG. 9, a combined signal is processed down randomly-selected signal-processing paths of the remaining converter stages of the system 80 of FIG. 6 converter system to thereby realize significant improvements in system linearity. This processing provides a combined digital code at the output of the aligner/corrector 27. The second portion of this combined digital code corresponds to the injected analog dither signal in FIG. 9. The back-end decoder 84B of FIG. 9 responds to the code of the PN generator 81 and provides the second portion so that it is removed in the difference 90 of FIG. 6.

As previously noted, the back-end signal converter 25B of FIG. 6 processes an analog output signal from a preceding one of the stages into a corresponding digital code $C_{dgtl}$ but does not need to form a respective analog output signal. This stage may, therefore, simply comprise an embodiment similar to the signal converter portion 161 of FIG. 9. In FIG. 7C, the central converter subrange of the analog output signal 105 of FIG. 7B is repeated along with its dithered operating levels. Below this figure, the dithered operating levels are repeated along with exemplary comparator levels of the back-end signal converter 25B. These levels may be set, for example, by the ladder 48 of FIG. 9.

In the embodiment of FIG. 9, the signal comparators 46 essentially compare their input signals to ground. Fabrication imperfections, however, often cause comparators to have an offset voltage so that they compare their input signal to an offset signal that slightly differs from ground. These imperfections, therefore, may alter the comparator levels as shown in the lowest plot of FIG. 7C.

The altered comparator levels will occasionally introduce errors into the digital code of the back-end signal converter 25B and, unlike earlier signal converters, there is generally no mechanism to correct the conversion errors of this signal converter. In a feature of the present disclosure, however, dither points propagate through the converter stages and cover a substantial portion of each converter subrange as shown in FIG. 7B. Accordingly, dithered levels will be compared in the back-end signal converter to comparator levels which are essentially dithered and this dither action will randomize and reduce the digital code errors.

An important part of the system 80 of FIG. 6 is the signal sampler 24 which provides a stable analog output signal to the succeeding signal converter stage during the φ1 operational phase of this stage. The signal sampler, however, increases the power demand of the system and adds some distortion and noise to the system's output digital code.

Figure 10:
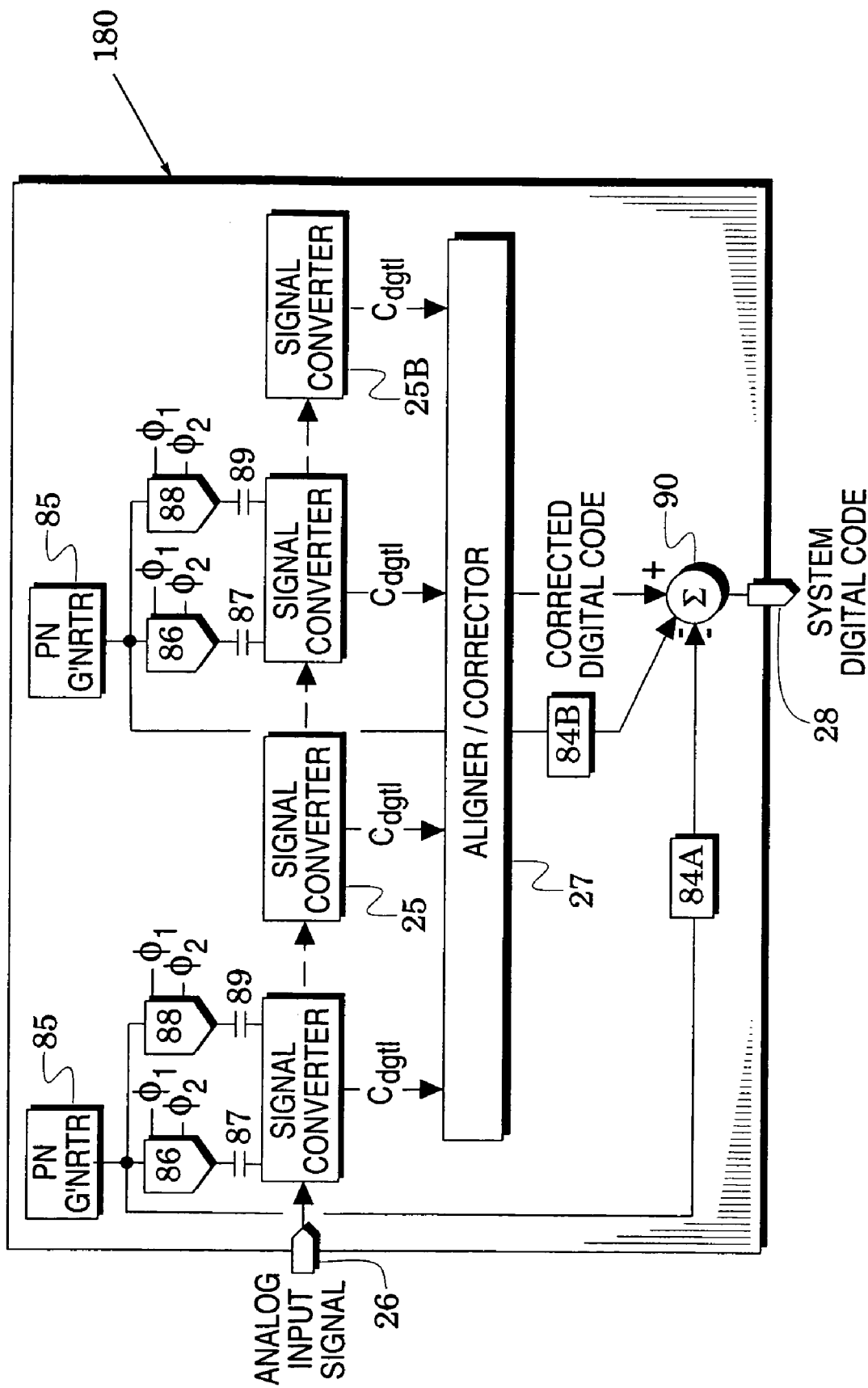
FIG. 10 is a diagram of another converter system embodiment.

In contrast, the converter system 180 of FIG. 10 is configured without a signal sampler so that it reduces power demand and reduces the output distortion and noise of the system 80. The system 180 is similar to the system 80 with like elements indicated by like reference numbers. In contrast, however, a frontend one of the signal converters 25 replaces the signal sampler and the DACs 86 and 88 and dither capacitors 87 and 89 are also coupled to the this signal converter. Signal samplers are often referred to as sample-and-hold amplifiers and abbreviated as "sha". In this nomenclature, the converter system 80 of FIG. 6 is a sha system and the converter system 180 of FIG. 10 is a sha-less system.

In the system 80, the signal sampler (e.g., the signal sampler 150 of FIG. 8B) held its analog output signal substantially constant throughout the φ1 operational phase of the succeeding signal converter. Thus, the signal comparator section of the succeeding signal converter had most of the φ1 operational phase to capture this held analog output signal. The captured signal can then be processed in the succeeding φ2 operational phase. In a sha-less system, the initial signal converter must not only process samples of the system's analog input signal but, prior to the processing, it must also capture these samples. This places significant timing demands on this initial stage.

Figure 11:
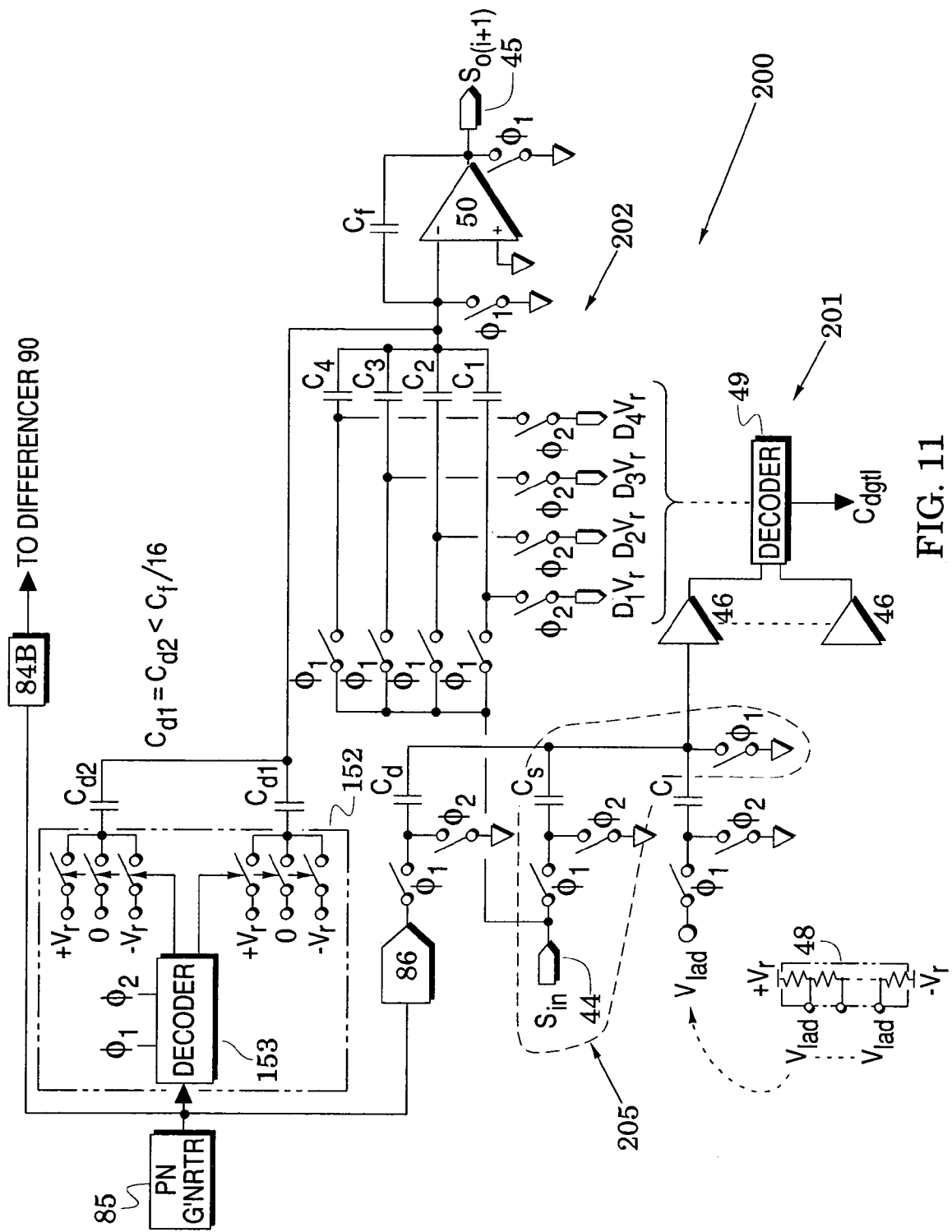
FIG. 11 is a diagram of a frontend signal converter embodiment for use in the system of FIG. 10.

FIG. 11 illustrates a signal converter embodiment 200 for use as the signal converter 25F in the converter system 180 of FIG. 10. The converter 200 includes an MDAC portion 202 which is similar to the MDAC portion 162 of FIG. 9 with like elements indicated by like reference numbers. In contrast, however, the MDAC portion 202 includes the signal capacitors $C_1$-$C_4$ and associated structure that were introduced in FIG. 2 for a 2.5 bit converter stage.

The converter 200 also includes a signal comparator portion 201 which is similar to the signal comparator portion 161 of FIG. 9 with like elements indicated by like reference numbers. Again in contrast, however, the signal comparator portion 201 substitutes the signal capacitor structure that was utilized in the signal sampler 150 of FIG. 8B and that is enclosed in a broken-line enclosure 205 in both figures. Also, the ladder signal $V_{lad}$ is now applied to the ladder capacitor $C_1$ through a φ1 switch and a φ2 switch is inserted to couple the input side of the ladder capacitor to ground. In a similar manner, the dither signal from the DAC 86 is now applied to the dither capacitor $C_d$ through a φ1 switch and a φ2 switch is inserted to couple the input side of the dither capacitor to ground.

In the φ1 operational phase, the signal comparator section 201 is now configured to transfer signal charges from the analog input signal at the input port 44 to the signal capacitor $C_s$, transfer ladder charges from the ladder 48 to ladder capacitor $C_1$, and transfer dither charges from the DAC 86 to the dither capacitor $C_d$. The φ1 switch at the input to the respective comparator 46 preferably opens slightly ahead of other φ1 switches to thereby establish and capture these signals. Thus, the signal comparator section 201 is structured to capture signal samples in the signal capacitor $C_s$, ladder signals in the ladder capacitor $C_1$, and dither signals in the dither capacitor $C_d$.

When the φ2 switches close, a comparator signal $S_{comp}$ is established at the input to the comparator 46. This comparator signal $S_{comp}$ is set by the ratio of the total of the captured charges to the total capacitance which is the sum of the capacitances of the signal capacitor $C_s$, ladder capacitor $C_1$, and dither capacitor $C_d$. The comparator signal $S_{comp}$ then determines the latched state of the comparator 46.

The remaining structures of the converter system 180 of FIG. 10 operate in manners similar to those described above for corresponding structures of the converter system 80 of FIG. 6.

An enabling disclosure has been provided of signal converter system embodiments which substantially reduce symmetrical and asymmetrical INL errors. The embodiments of the disclosure described herein are exemplary and numerous modifications, variations and rearrangements can be readily envisioned to achieve substantially equivalent results, all of which are intended to be embraced within the spirit and scope of the appended claims

We claim:

1. An analog-to-digital converter system to convert an analog input signal to a system digital code, comprising:
    a sampler to provide samples of said analog input signal;
    signal converters arranged and configured to successively process said samples;
    at least one digital-to-analog converter configured to respond to a random digital code and inject analog dither signals into at least a selected one of said sampler and said signal converters which process said samples and said analog dither signals into a plurality of digital codes;
    an aligner/corrector coupled to said signal converters to process said plurality of digital codes into a combined digital code that includes a first portion that corresponds to said samples and a second portion that corresponds to said analog dither signals; and
    a decoder having a transfer function configured to convert said random digital code to said second portion for differencing with said combined digital code to thereby provide said system digital code;
    said samples thus processed along different signal-processing paths of said signal converters to thereby enhance linearity of said system.

2. The system of claim 1, further including:
    a pseudorandom generator to provide said random digital code; and
    a differencer to difference said second portion and said combined digital code to provide said system digital code.

3. The system of claim 1, wherein said analog dither signals are injected into said sampler, an initial one of said signal converters is configured to provide analog output signals to a succeeding signal converter with an amplitude limited to an output-signal window, and the amplitude of said analog dither signals is selected so that said analog output signals dither over a predetermined dither range.

4. The system of claim 3, wherein said predetermined dither range is less than said output-signal window.

5. The system of claim 3, wherein said predetermined dither range is greater than said output-signal window.

6. The system of claim 3, wherein the amplitude of said analog dither signals is varied over N dither levels and said predetermined dither range is substantially (N−1)/N of said output-signal window.

7. The system of claim 3, wherein said sampler includes at least one capacitor and said digital-to-analog converter is configured to switchably couple different voltages to said capacitor to thereby inject said analog dither signals.

8. The system of claim 1, wherein:
    said analog dither signals are injected into a selected one of said signal converters which is configured to provide analog output signals to a succeeding signal converter with an amplitude limited to an output-signal window; and
    the amplitude of said analog dither signals is selected so that said analog output signals dither over a predetermined dither range.

9. The system of claim 8, wherein said predetermined dither range is less than said output-signal window.

10. The system of claim 8, wherein said predetermined dither range is greater than said output-signal window.

11. The system of claim 8, wherein the amplitude of said analog dither signals is varied over N dither levels and said predetermined dither range is substantially (N−1)/N of said output-signal window.

12. The system of claim 8, wherein said selected signal converter includes at least first and second dither capacitors and said digital-to-analog converter is configured to switchably couple different voltages to said first dither capacitor to thereby contribute to said analog dither signals and switchably couple different voltages to said second dither capacitor to thereby contribute to a respective one of said plurality of digital codes.

13. An analog-to-digital converter system to convert an analog input signal to a system digital code, comprising:
   signal converters arranged and configured to provide and successively process samples of said analog input signal;
   at least one digital-to-analog converter configured to respond to a random digital code and inject corresponding analog dither signals into at least a selected one of said signal converters to enable said selected signal converter and succeeding signal converters to successively process said analog dither signals, processing of said samples and said analog dither signals thereby generating a plurality of digital codes;
   an aligner/corrector coupled to said signal converters to process said plurality of digital codes into a combined digital code that includes a first portion that corresponds to said samples and a second portion that corresponds to said analog dither signals; and
   a decoder having a transfer function configured to convert said random digital code to said second portion for differencing with said combined digital code to thereby provide said system digital code;
   said samples thus processed along different signal-processing paths of said signal converters to thereby enhance conversion linearity of said system.

14. The system of claim 13, further including:
   a pseudorandom generator to provide said random digital code; and
   a differencer to difference said second portion and said combined digital code to provide said system digital code.

15. The system of claim 13, wherein:
   said selected signal converter is configured to provide analog output signals to a succeeding signal converter with an amplitude limited to an output-signal window; and
   the amplitude of said analog dither signals is selected so that said analog output signals dither over a predetermined dither range.

16. The system of claim 15, wherein said predetermined dither range is less than said output-signal window.

17. The system of claim 15, wherein said predetermined dither range is greater than said output-signal window.

18. The system of claim 15, wherein the amplitude of said analog dither signals are varied over N dither levels and said predetermined dither range is substantially $(N-1)/N$ of said output-signal window.

19. The system of claim 15, wherein said selected signal converter includes at least one dither capacitor and said digital-to-analog converter is configured to switchably couple different voltages to said dither capacitor to thereby contribute to said analog output signals.

20. The system of claim 15, wherein said selected signal converter includes at least one dither capacitor and said digital-to-analog converter is configured to switchably couple different voltages to said dither capacitor to thereby contribute to a respective one of said plurality of digital codes.

* * * * *